US008165325B2

(12) United States Patent
Bai et al.

(10) Patent No.: US 8,165,325 B2
(45) Date of Patent: Apr. 24, 2012

(54) AUTOMOTIVE VIRTUAL SURROUND AUDIO SYSTEM

(75) Inventors: Ming-Sian Bai, Hsinchu (TW); Chih-Chung Lee, Dali (TW); Hui-Wen Chen, Taiping (TW)

(73) Assignee: Sunplus Technology Co., Ltd., Hsinchu (TW)

( * ) Notice: Subject to any disclaimer, the term of this patent is extended or adjusted under 35 U.S.C. 154(b) by 674 days.

(21) Appl. No.: 12/318,930

(22) Filed: Jan. 13, 2009

(65) Prior Publication Data

US 2009/0180625 A1 Jul. 16, 2009

(30) Foreign Application Priority Data

Jan. 14, 2008 (TW) ................................ 97101366 A

(51) Int. Cl.
*H04R 5/02* (2006.01)
*H03G 3/00* (2006.01)

(52) U.S. Cl. ........................................ 381/302; 381/307

(58) Field of Classification Search .............. 381/17–22, 381/86, 302, 307
See application file for complete search history.

(56) References Cited

U.S. PATENT DOCUMENTS

| | | | | |
|---|---|---|---|---|
| 5,193,118 | A | 3/1993 | Latham-Brown et al. | |
| 5,319,713 | A * | 6/1994 | Waller et al. | 381/22 |
| 6,501,843 | B2 | 12/2002 | Usui et al. | |
| 7,164,773 | B2 | 1/2007 | Fabry | |
| 7,206,413 | B2 | 4/2007 | Eid et al. | |
| 7,271,812 | B2 | 9/2007 | Van Dyke et al. | |

* cited by examiner

*Primary Examiner* — Ping Lee
(74) *Attorney, Agent, or Firm* — Bacon & Thomas, PLLC

(57) ABSTRACT

An automotive virtual surround audio system is implemented in an automobile to receive left- and right-channel audio sources. A synthesizer receives the left- and right-channel audio sources to extend the sources into temporary rear-left and rear-right audio sources. A weighting device receives the left- and right-channel audio sources to perform a weighting operation and produce temporary front-left and front-right audio sources. A first filter receives the temporary front-left and front-right audio sources to perform a filtering operation and produce virtual front-left and front-right audio sources. A second filter receives the temporary rear-left and rear-right audio sources to perform a filtering operation and produce virtual rear-left and rear-right audio sources. Thus, the virtual audio image position is reproduced.

6 Claims, 5 Drawing Sheets

AUTOMOTIVE VIRTUAL SURROUND AUDIO SYSTEM

BACKGROUND OF THE INVENTION

1. Field of the Invention

The present invention relates to the technical field of audio processing and, more particularly, to an automotive virtual surround audio system.

2. Description of Related Art

Current playback contents such as a CD, an MP3 and a broadcast are rendered with left- and right-channel audio sources. However, an automotive audio system is equipped with four speakers, i.e., front-left (FL), rear-left (RL), front-right (FR) and rear-right (RR). Accordingly, the prior art typically sends the left-channel audio source to the front-left (FL) and rear-left (RL) speakers and also the right-channel audio source to the front-right (FR) and rear-right (RR) speakers. Such a way lacks of the surround effect because the tandem playback content is very similar, without completely applying the benefit of multi-channel audio.

The speakers of the automotive audio system typically are positioned in the car doors. In addition, due to a listener does not seat at a center position of the car, the perceptual audio to the listener is tilted to a certain side and has a lower elevation. The perceptual audio for the listener at the rear seat is directed typically by the speaker behind the head. Namely, the music is from the rear in listening. When viewing a multi-channel movie, only the surround audio is played, and the front audio sources responsible for positioning cannot be reproduced clearly, which causes the positioning uncertainty.

Therefore, U.S. Pat. No. 6,501,843 granted to Usui, et al. for an "Automotive audio reproducing apparatus" has disclosed a head related transfer function (HRTF) to find corresponding inverse filters. However, such a technique assumes that a plant is symmetric and locates a dummy on the center of an automobile for measurement to thereby obtain the parameters associated with the plant. In this case, only two channel input signals and the front listeners are considered. In addition, a rear speaker plays a low frequency signal only, which does not sufficiently apply the features of a multi-channel speaker system.

U.S. Pat. No. 7,206,413 granted to Eid, et al. for a "Sound processing system using spatial imaging techniques" has disclosed a crossbar matrix mixer to convert N input signals into M output signals. However, such a technique only uses different weights to mix the channel signals, which cannot overcome the problem that the listener is affected essentially by the audio of the closest speaker. In addition, the positioning required by the multi-channel content (such as DVD) is uncertain due to the mixed audio.

U.S. Pat. No. 7,164,773 granted to Fabry for a "Vehicle electroacoustical transducing" has disclosed seven electroacoustical transducers, including four being positioned at four doors, one at the front windshield and two at the rear parcel shelf behind rear seats in an automobile. Three transducers at the front seats provide the front-left (FL), the front-right (FR) and the front center channel audio sources respectively, two transducers on the rear parcel shelf provide the rear-left and the rear-right channel audio sources respectively, and two transducers at the rear doors provide the surround channel audio sources for the front passengers and the front channel audio sources for the rear passengers, which can play all audio signals. For example, the front-left, the rear-left and the front center channel audios can be rendered at the left side. Such a way essentially positions a certain number of transducers or speakers in the compartment of the automobile to thereby obtain the multi-channel audio system. However, as cited above, the number of used speakers is higher. In addition, the asymmetry between a listener and the speakers still exists, and the problem of position confusing can easily occur when the two speakers at the rear doors provide a mixed audio containing all signals.

U.S. Pat. No. 5,193,118 granted to Latham-Brown, et al. for a "Sound processing system using spatial imaging techniques" has disclosed four gamut speakers placed at four doors, and a woofer placed below a front seat. The two-channel input signal is outputted to the speakers directly. For example, the left channel signal is sent to the front-left and the rear-left speakers. Such a way only defines the location of the speakers and cannot overcome the problem of poor listening compartment in an automobile. In addition, this patent only focuses on two channel inputs, and the channel extension technique therein copies the original two channels to the ambient channel only.

Therefore, it is desirable to provide an improved system to mitigate and/or obviate the aforementioned problems.

SUMMARY OF THE INVENTION

The object of the present invention is to provide an automotive virtual surround audio system, which can overcome the problem of having no sound effect in the prior art when only the audio signals are sent to the rear speakers. The invention also uses a reverberator to produce a surround signal, which can have different playback contents and appropriately produce the spatial sense to reduce the inefficiency on positioning.

According to a feature of the invention, the invention provides an automotive virtual surround audio system, which is implemented in an automobile to receive left- and right-channel audio sources to accordingly reproduce an accurate virtual audio image position. The system includes a synthesizer, a weighting device, a first filter and a second filter. The synthesizer receives the left- and right-channel audio sources in order to extend the sources into temporary rear-left and rear-right audio sources. The weighting device receives the left- and right-channel audio sources in order to perform a weighting operation and accordingly produce temporary front-left and front-right audio sources. The first filter receives the temporary front-left and front-right audio sources in order to perform a filtering operation and accordingly produce virtual front-left and front-right audio sources. The second filter receives the temporary rear-left and rear-right audio sources in order to perform a filtering operation and accordingly produce virtual rear-left and rear-right audio sources.

According to another feature of the invention, the invention provides an automotive virtual surround audio system, which is implemented in an automobile to receive left- and right-channel audio sources to accordingly reproduce an accurate virtual audio image position. The system includes a synthesizer and a first weighting and delay device. The synthesizer receives the left- and right-channel audio sources in order to extend the sources into temporary rear-left, rear-right, front-left and front-right audio sources. The first weighting and delay device is connected to the synthesizer in order to receive the temporary audio sources to accordingly produce virtual rear-left, rear-right, front-left and front-right audio sources. The virtual front-left audio source is obtained by adding the temporary front-left audio source and the temporary rear-left audio source. The virtual rear-left audio source is obtained by performing a weighting operation and a delaying operation on the virtual front-left audio source. The virtual front-right audio source is obtained by adding the temporary front-right audio source and the temporary rear-right audio source. The virtual rear-right audio source is obtained by performing the weighting operation and the delaying operation on the virtual front-right audio source.

According to a further feature of the invention, the invention provides an automotive virtual surround audio system, which is implemented in an automobile to receive a five-channel audio source to accordingly reproduce an accurate virtual audio image position. The system includes a mixer, a first filter and a second filter. The mixer receives front-left, front-right and center channel audio sources of the five-channel audio source in order to extend the sources into temporary front-left and front-right audio sources. The first filter is connected to the mixer in order to receive the temporary front-left and front-right audio sources to accordingly perform a filtering operation and produce virtual front-left and front-right audio sources. The second filter receives rear-left and rear-right audio sources of the five-channel audio source in order to perform a filtering operation and accordingly produce virtual rear-left and rear-right audio sources.

According to another further feature of the invention, the invention provides an automotive virtual surround audio system, which is implemented in an automobile to receive a five-channel audio source to accordingly reproduce an accurate virtual audio image position. The system includes a mixer, and a first weighting and delay device. The mixer receives front-left, front-right, rear-left, rear-right and center channel audio sources of the five-channel audio source in order to extend the sources into temporary rear-left, rear-right, front-left and front-right audio sources. The first weighting and delay device is connected to the mixer in order to receive the temporary rear-left, rear-right, front-left and front-right audio sources to accordingly produce virtual rear-left, rear-right, front-left and front-right audio sources. The virtual front-left audio source is obtained by adding the temporary front-left audio source and the temporary rear-left audio source. The virtual rear-left audio source is obtained by performing a weighting operation and a delaying operation on the virtual front-left audio source. The virtual front-right audio source is obtained by adding the temporary front-right audio source and the temporary rear-right audio source. The virtual rear-right audio source is obtained by performing the weighting operation and the delaying operation on the virtual front-right audio source.

Other objects, advantages, and novel features of the invention will become more apparent from the following detailed description when taken in conjunction with the accompanying drawings.

DETAILED DESCRIPTION OF THE PREFERRED EMBODIMENT

Figure 1:
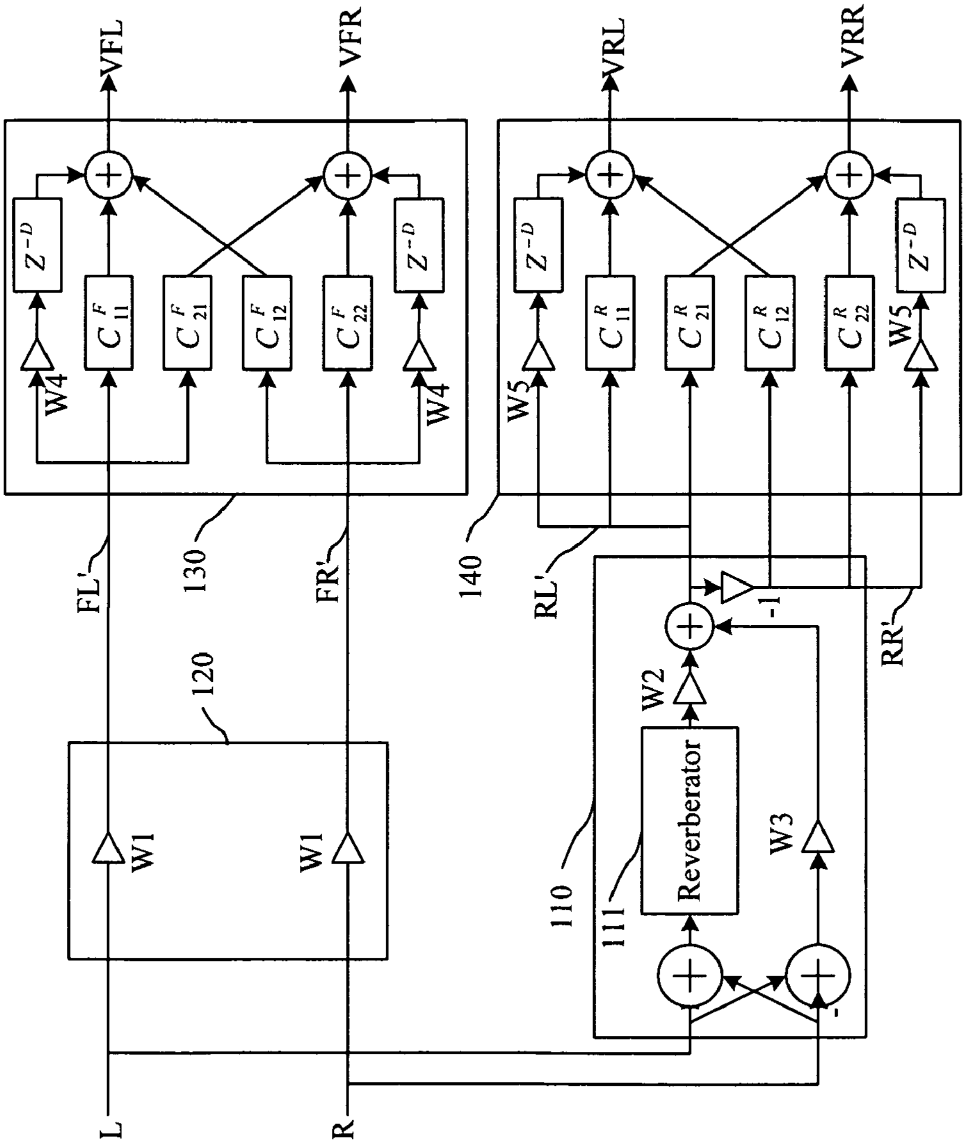
FIG. 1 is a block diagram of an automotive virtual surround audio system according to the invention.

FIG. 1 is a block diagram of an automotive virtual surround audio system according to the invention. The system is implemented in an automobile to receive a two-channel audio source, i.e., left and right channel audio sources, to thereby reproduce the accurate virtual audio image position. In FIG. 1, the system includes a synthesizer 110, a weighting device 120, a first filter 130 and a second filter 140.

The synthesizer 110 receives the left-channel and right-channel audio sources L and R in order to extend the sources into temporary rear-left and rear-right audio sources RL' and RR'.

The weighting device 120 receives the left- and right-channel audio sources L and R in order to perform a weighting operation and accordingly produce temporary front-left and front-right audio sources FL' and FR'.

Namely, the input signals are the left channel audio source L and the right channel audio source R, which are further extended into four channels. The temporary front-left audio source FL' and the temporary front-right audio source FR' are obtained by multiplying the input signals (L, R) by a weight w1.

The input signals L and R are passed through the synthesizer 110 to thereby obtain the audio sources RL' and RR'. Namely, the temporary rear-left audio source RL' is obtained by adding the input signals L and R, passing the added signal (L+R) through the reverberator 111, multiplying the passed signal by a weight w2 to thereby produce a weighted left channel signal, and adding the weighted left channel signal with a weighted right channel signal, which is obtained by multiplying a subtracted signal (L-R) by a weight w3. The temporary rear-right audio source RR' is obtained by passing the temporary rear-left audio source RL' through an amplifier with negative unit gain.

Figure 2:
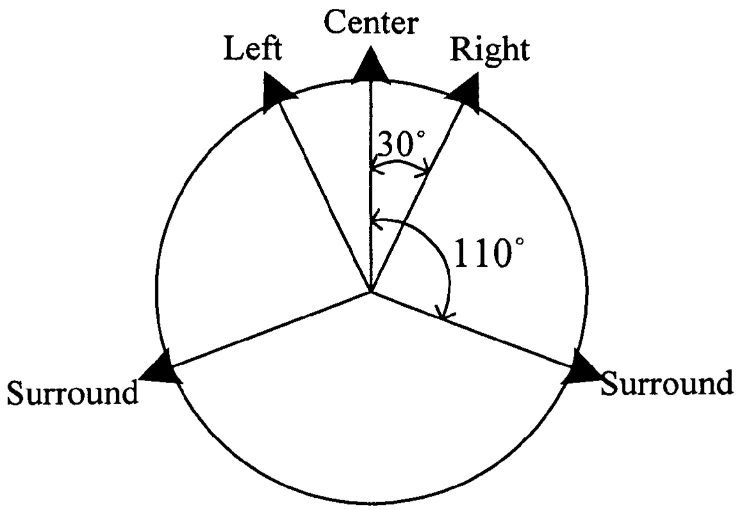
FIG. 2 is a schematic graph of a standard 5.1 channel arrangement according to the invention.

Then, a first filter 130 and a second filter 140 are employed to process the front and the rear channel audio sources respectively for the following purposes: (1) performing a de-reverberation to process the small spatial reflection, and (2) appropriately locating the virtual audio image position. FIG. 2 shows a schematic graph of a standard 5.1 channel arrangement according to the invention. Upon the standard 5.1 channel arrangement, the included angles are ±30 degrees for the front speakers and ±110 degrees for the rear speakers. Accordingly, the virtual audio image orientations can be located by a head-related transfer function (HRTF).

The first filter 130 receives the temporary front-left and front-right audio sources FL' and FR' in order to perform a filtering operation and accordingly produce virtual front-left and front-right audio sources VFL and VFR.

The second filter 140 receives the temporary rear-left and rear-right audio sources RL' and RR' in order to perform a filtering operation and accordingly produce virtual rear-left and rear-right audio sources VRL and VRR.

Figure 3:
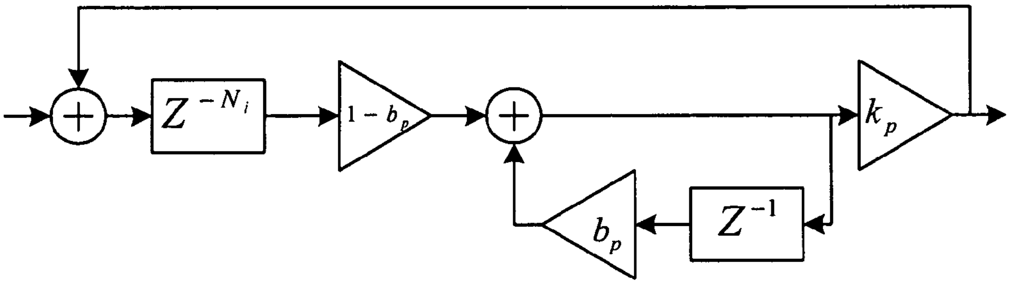
FIG. 3 is a block diagram of a comb filter according to the invention.
Figure 4:
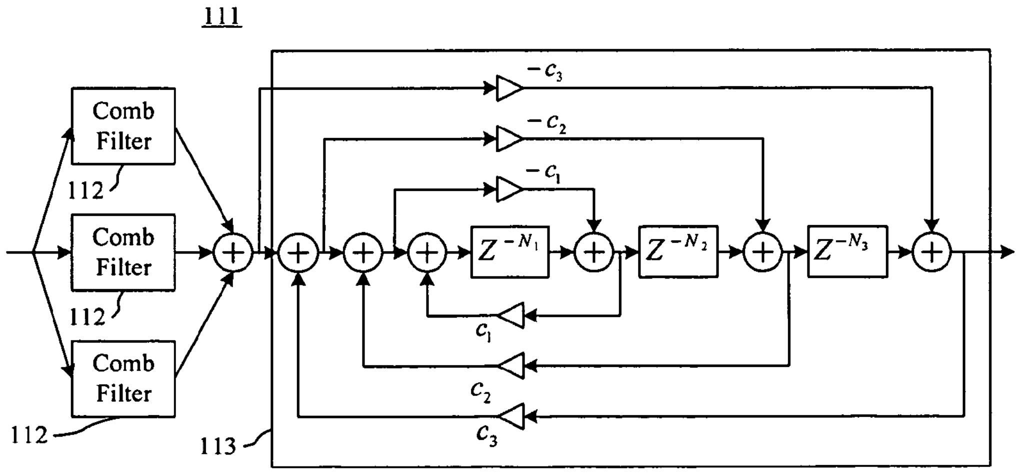
FIG. 4 is a block diagram of a reverberator according to the invention.

The synthesizer 110 shown in FIG. 1 includes the reverberator 111, three adders, two multipliers and one amplifier. The reverberator 111 has three comb filters 112 and a three-layer nested all-pass filter 113. FIG. 3 is a block diagram of a comb filter 112 according to the invention, and FIG. 4 is a block diagram of the reverberator 111 according to the invention.

The included angles are ±30 degrees for the speakers corresponding to the virtual front-left channel audio source VFL and the virtual front-right channel audio source VFR respectively. The sources VFL and VFR can be expressed as follows:

$$\begin{bmatrix} VFL(n) \\ VFR(n) \end{bmatrix} = \begin{bmatrix} C_{11}^F(n) & C_{12}^F(n) \\ C_{21}^F(n) & C_{22}^F(n) \end{bmatrix} \otimes \begin{bmatrix} FL'(n) \\ FR'(n) \end{bmatrix},$$

where VFL(n) indicates the virtual front-left channel audio source VFL, VFR(n) indicates the virtual front-right channel audio source VFR, FL'(n) indicates the temporary front-left audio source FL', FR'(n) indicates the temporary front-right audio source FR', and the parameters $C_{11}^F(n)$, $C_{12}^F(n)$, $C_{21}^F(n)$, $C_{22}^F(n)$ are expressed as:

$$\begin{bmatrix} H_i^{30}(n) & H_c^{30}(n) \\ H_c^{30}(n) & H_i^{30}(n) \end{bmatrix} = \begin{bmatrix} P_{L,FL} & P_{L,FR} \\ P_{R,FL} & P_{R,FR} \end{bmatrix} \otimes \begin{bmatrix} C_{11}^F(n) & C_{12}^F(n) \\ C_{21}^F(n) & C_{22}^F(n) \end{bmatrix},$$

where $H_i^{30}(n)$ indicates a 30-degree-same-side HRTF, $H_c^{30}(n)$ indicates a 30-degree-counter-side HRTF, $P_{L,FL}$ indicates a transfer function for a front-left speaker to a left ear, $P_{R,FL}$ indicates a transfer function for the front-left speaker to a right ear, $P_{L,FR}$ indicates a transfer function for a front-right speaker to the left ear, and $P_{R,FR}$ indicates a transfer function for the front-right speaker to the right ear.

Similarly, the sources VRL and VRR can be expressed as follows:

$$\begin{bmatrix} VRL(n) \\ VRR(n) \end{bmatrix} = \begin{bmatrix} C_{11}^R(n) & C_{12}^R(n) \\ C_{21}^R(n) & C_{22}^R(n) \end{bmatrix} \otimes \begin{bmatrix} RL'(n) \\ RR'(n) \end{bmatrix},$$

where VRL(n) indicates the virtual rear-left channel audio source VRL, VRR(n) indicates the virtual rear-right channel audio source VRR, RL'(n) indicates the temporary rear-left audio source RL', RR'(n) indicates the temporary rear-right audio source RR', and the parameters $C_{11}^R(n)$, $C_{11}^R(n)$, $C_{21}^R(n)$, $C_{21}^R(n)$ are expressed as:

$$\begin{bmatrix} H_i^{110}(n) & H_c^{110}(n) \\ H_c^{110}(n) & H_i^{110}(n) \end{bmatrix} = \begin{bmatrix} P_{L,RL} & P_{L,RR} \\ P_{R,RL} & P_{R,RR} \end{bmatrix} \otimes \begin{bmatrix} C_{11}^R(n) & C_{12}^R(n) \\ C_{21}^R(n) & C_{22}^R(n) \end{bmatrix},$$

where $H_i^{110}(n)$ indicates a 110-degree-same-side HRTF, $H_c^{110}(n)$ indicates a 110-degree-counter-side HRTF, $P_{L,RL}$ indicates a transfer function for a rear-left speaker to a left ear, $P_{R,RL}$ indicates a transfer function for the rear-left speaker to a right ear, $P_{L,RR}$ indicates a transfer function for a rear-right speaker to the left ear, and $P_{R,RR}$ indicates a transfer function for the rear-right speaker to the right ear.

Figure 5:
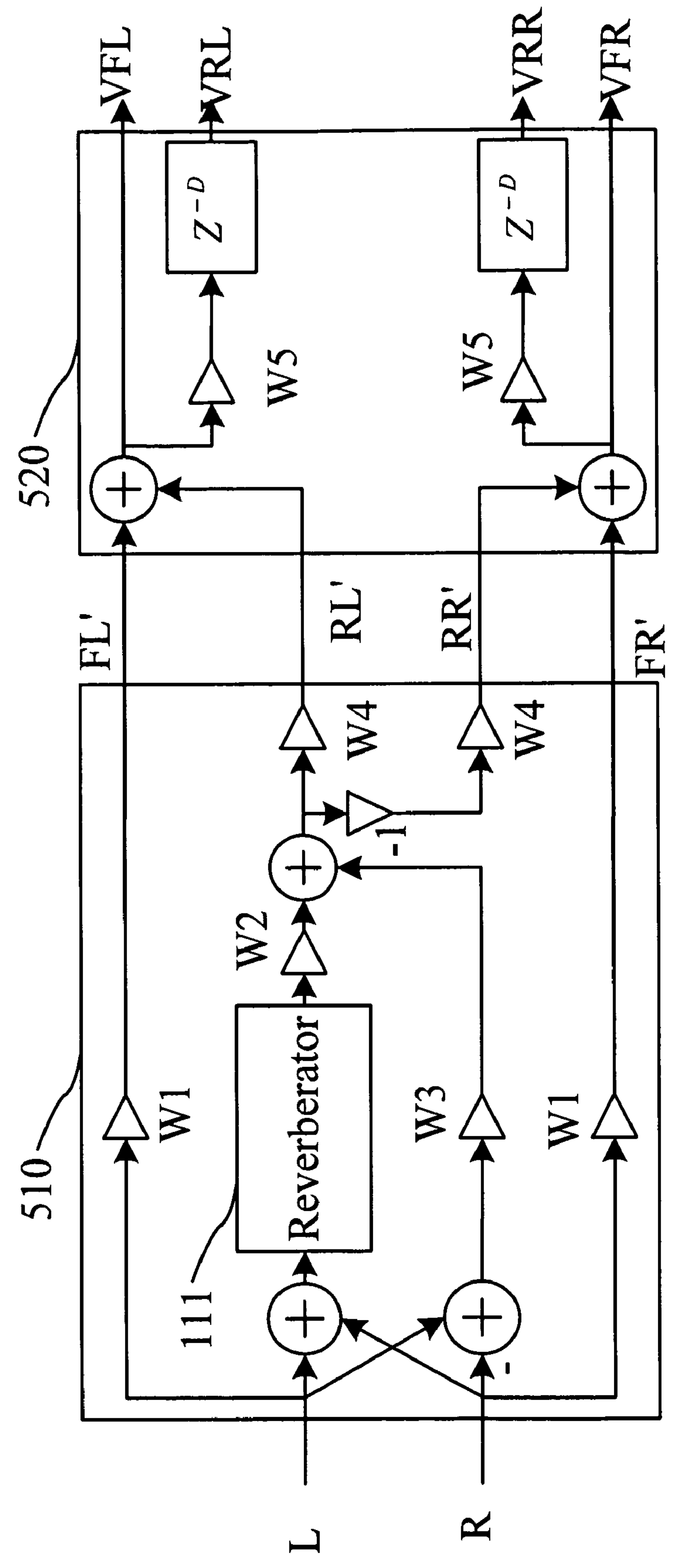
FIG. 5 is a block diagram of another embodiment of an automotive virtual surround audio system according to the invention.

FIG. 5 is a block diagram of another embodiment of an automotive virtual surround audio system according to the invention. The system is implemented in an automobile to receive left- and right-channel audio sources to accordingly reproduce an accurate virtual audio image position, and includes a synthesizer 510 and a first weighting and delay device 520.

The synthesizer 510 receives the left- and right-channel audio sources in order to extend the sources into temporary rear-left, rear-right, front-left and front-right audio sources RL', RR', FL' and FR'.

The first weighting and delay device 520 is connected to the synthesizer 510 in order to receive the temporary audio sources RL', RR', FL' and FR' to accordingly produce virtual rear-left, rear-right, front-left and front-right audio sources VRL, VRR, VFL and VFR.

The virtual front-left audio source VFL is obtained by adding the temporary front-left audio source FL' and the temporary rear-left audio source RL'. The virtual rear-left audio source VRL is obtained by performing a weighting operation and a delaying operation on the virtual front-left audio source VFL. The virtual front-right audio source VFR is obtained by adding the temporary front-right audio source FR' and the temporary rear-right audio source RR'. The virtual rear-right audio source VRR is obtained by performing the weighting operation and the delaying operation on the virtual front-right audio source VFR.

The weighting operation is performed with a weight of 0.65, and the delaying operation is performed with a delay of 20 ms. The synthesizer 510 can be configured as similar as the configuration of FIG. 1, with a reverberator 111, three adders, six multipliers and one amplifier. The reverberator 111 has three comb filters 112 and a 3-layer nested all-pass filter, as shown in FIG. 4.

In this embodiment, the two input signals, i.e., the left and the right channel audio sources L, R, are extended into four channel signals, i.e., the temporary audio sources FL', FR', RL', RR'. Next, the temporary front-left audio source FL' adds the temporary rear-left audio source RL' to thus produce the virtual front-left audio source VFL, and the temporary front-right audio source FR' adds the temporary rear-right audio source RR' to thus produce the virtual front-right audio source VFR. Next, the virtual front-left audio source VFL and the virtual front-right audio source VFR are output to corresponding front speakers, and also performed a weighting operation and a delay (10 ms to 30 ms) in order to produce the virtual rear-left audio source VRL and the virtual rear-right audio source VRR respectively for further output to corresponding rear speakers.

In comparing the inventive audio processing technique with the prior original audio processing technique, which outputs the left-channel audio source as a front-left and a rear-left audio sources and the right-channel audio source as a front-right and a rear-right audio sources, there are some differences as follows: (1) There is no stereo effect because the playback content is almost the same when the original audio processing technique outputs a same audio signal to the front and rear of a same side of an automobile, whereas the invention uses the synthesizer to produce the surround signal to thereby produce different playback contents at the front and the rear and also produce the appropriate spatial sense to improve the positioning uncertainty; (2) When a four-channel signal is directly produced and output to corresponding speakers, a front-seat listener mostly hears the audio of non-processed two-channel signal, and a rear-seat listener hears the lingering audio produced by the synthesizer, and in order to avoid the problem above, the invention mixes the front and the rear signals for balance; (3) When the mixed signal is directly output to the four-channel speakers, the front and rear playback content is close, and in order to avoid the problem above, the invention weights and delays (10 ms and above) the mixed signal before sending to the ambient channels.

Figure 6:
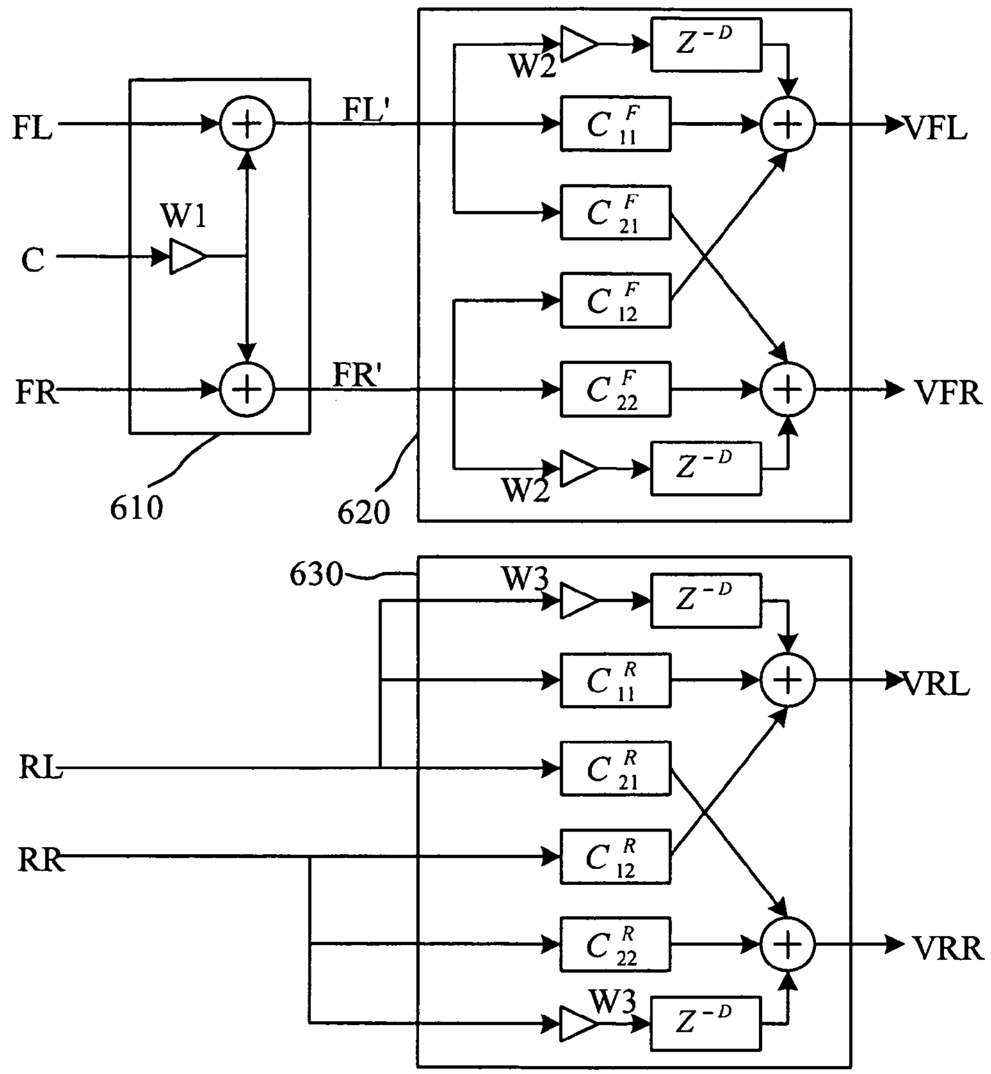
FIG. 6 is a block diagram of a further embodiment of an automotive virtual surround audio system according to the invention.

FIG. 6 is a block diagram of a further embodiment of an automotive virtual surround audio system according to the invention. The system is implemented in an automobile to receive a five-channel audio source to accordingly reproduce an accurate virtual audio image position, and includes a mixer 610, a first filter 620 and a second filter 630.

The mixer 610 includes a weighting device and two adders, and receives front-left, front-right and center channel audio sources FL, FR and C of the five-channel audio source in order to extend the sources into temporary front-left and front-right audio sources FL' and FR'.

The first filter 620 is connected to the mixer 610 in order to receive the temporary front-left and front-right audio sources FL' and FR' in order to perform a filtering operation and accordingly produce virtual front-left and front-right audio sources VFL and VFR.

The second filter 630 receives rear-left and rear-right audio sources RL and RR of the five-channel audio source in order to perform a filtering operation and accordingly produce virtual rear-left and rear-right audio sources VRL and VRR.

The sources VFL and VFR can be expressed as follows:

$$\begin{bmatrix} VFL(n) \\ VFR(n) \end{bmatrix} = \begin{bmatrix} C_{11}^F(n) & C_{12}^F(n) \\ C_{21}^F(n) & C_{22}^F(n) \end{bmatrix} \otimes \begin{bmatrix} FL'(n) \\ FR'(n) \end{bmatrix},$$

where VFL(n) indicates the virtual front-left channel audio source VFL, VFR(n) indicates the virtual front-right channel audio source VFR, FL'(n) indicates the temporary front-left audio source FL', FR'(n) indicates the temporary front-right audio source FR', and the parameters $C_{11}^F(n)$, $C_{12}^F(n)$, $C_{21}^F(n)$, $C_{22}^F(n)$ are expressed as:

$$\begin{bmatrix} H_i^{30}(n) & H_c^{30}(n) \\ H_c^{30}(n) & H_i^{30}(n) \end{bmatrix} = \begin{bmatrix} P_{L,FL} & P_{L,FR} \\ P_{R,FL} & P_{R,FR} \end{bmatrix} \otimes \begin{bmatrix} C_{11}^F(n) & C_{12}^F(n) \\ C_{21}^F(n) & C_{22}^F(n) \end{bmatrix},$$

where $H_i^{30}(n)$ indicates a 30-degree-same-side HRTF, $H_c^{30}(n)$ indicates a 30-degree-counter-side HRTF, $P_{L,FL}$ indicates a transfer function for a front-left speaker to a left ear, $P_{R,FL}$ indicates a transfer function for the front-left speaker to a right ear, $P_{L,FR}$ indicates a transfer function for a front-right speaker to the left ear, and $P_{R,FR}$ indicates a transfer function for the front-right speaker to the right ear.

Similarly, the sources VRL and VRR can be expressed as follows:

$$\begin{bmatrix} VRL(n) \\ VRR(n) \end{bmatrix} = \begin{bmatrix} C_{11}^R(n) & C_{12}^R(n) \\ C_{21}^R(n) & C_{22}^R(n) \end{bmatrix} \otimes \begin{bmatrix} RL'(n) \\ RR'(n) \end{bmatrix},$$

where VRL(n) indicates the virtual rear-left channel audio source VRL, VRR(n) indicates the virtual rear-right channel audio source VRR, RL'(n) indicates the temporary rear-left audio source RL', RR'(n) indicates the temporary rear-right audio source RR', and the parameters $C_{11}^R(n)$, $C_{12}^R(n)$, $C_{21}^R(n)$, $C_{22}^R(n)$ are expressed as:

$$\begin{bmatrix} H_i^{110}(n) & H_c^{110}(n) \\ H_c^{110}(n) & H_i^{110}(n) \end{bmatrix} = \begin{bmatrix} P_{L,RL} & P_{L,RR} \\ P_{R,RL} & P_{R,RR} \end{bmatrix} \otimes \begin{bmatrix} C_{11}^R(n) & C_{12}^R(n) \\ C_{21}^R(n) & C_{22}^R(n) \end{bmatrix},$$

where $H_i^{110}(n)$ indicates a 110-degree-same-side HRTF, $H_c^{110}(n)$ indicates a 110-degree-counter-side HRTF, $P_{L,RL}$ indicates a transfer function for a rear-left speaker to a left ear, $P_{R,RL}$ indicates a transfer function for the rear-left speaker to a right ear, $P_{L,RR}$ indicates a transfer function for a rear-right speaker to the left ear, and $P_{R,RR}$ indicates a transfer function for the rear-right speaker to the right ear.

The invention is applied for a 5.1-channel input signal such as DVD. In this case, there is no channel extension because the input signal is a multi-channel signal. In addition, the center channel signal C is first mixed with the front two-channel signal because only four speakers are provided.

Figure 7:
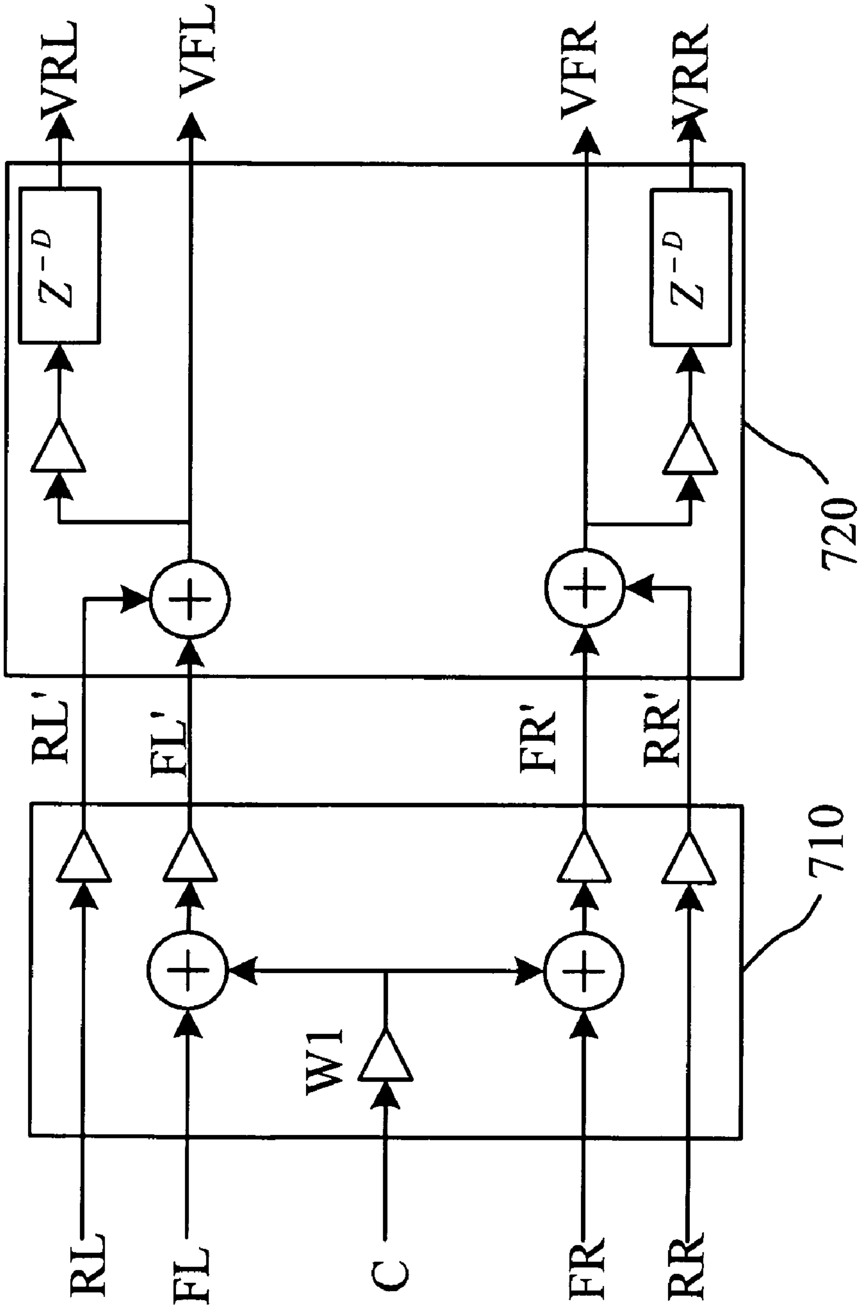
FIG. 7 is a block diagram of another further embodiment of an automotive virtual surround audio system according to the invention.

FIG. 7 is a block diagram of another further embodiment of an automotive virtual surround audio system according to the invention. The system is implemented in an automobile to receive a five-channel audio source to accordingly reproduce an accurate virtual audio image position, and includes a mixer 710 and a first weighting and delay device 720.

The mixer 710 receives front-left, front-right, rear-left, rear-right and center channel audio sources FL, FR, RL, RR and C of the five-channel audio source in order to extend the sources into temporary rear-left, rear-right, front-left and front-right audio sources RL', RR', FL' and FR'.

The first weighting and delay device 720 is connected to the mixer 710 in order to receive the temporary rear-left, rear-right, front-left and front-right audio sources RL', RR', FL' and FR' in order to accordingly produce virtual rear-left, rear-right, front-left and front-right audio sources VRL, VRR, VFL and VFR.

The virtual front-left audio source VFL is obtained by adding the temporary front-left audio source FL' and the temporary rear-left audio source RL'. The virtual rear-left audio source VRL is obtained by performing a weighting operation and a delaying operation on the virtual front-left audio source VFL. The virtual front-right audio source VFR is obtained by adding the temporary front-right audio source FR' and the temporary rear-right audio source RR'. The virtual rear-right audio source VRR is obtained by performing the weighting operation and the delaying operation on the virtual front-right audio source VFR. The weighting operation is performed with a weight of 0.65, and the delaying operation is performed with a delay of 20 ms.

In comparing the inventive audio processing technique with the prior original audio processing technique, there are some differences as follows: (1) The 5.1 channel surround channel can produce the ambient sense, but not responsible for positioning, so that a rear-seat passenger hears all the surround effect when the original audio is directly outputted. In order to correct this problem, the invention uses the first and the second filters to accurately reproduce the 5.1 channel positions and eliminate the problem that a certain speaker is dominant to the listener; (2) A mixed signal is a two-channel signal so that the front and rear playback contents are close when the mixed signal is directly output to the four-channel speakers in the prior art. In order to avoid the problem above, the invention weights and delays (10 ms and above) the mixed signal before sending to the ambient channels.

As cited, when the speakers in the prior art are located at the automobile doors and the listener is not located in the center, the perceptual audio to the listener is tilted to a single side and has a lower elevation. However, after the invention is applied, the audio sources produce a virtual audio image in the front of the listener at a height around the ears, and the entire perception is close in a typical listening space. In addition, the perceptual audio for a person at the rear seat in the prior art is directed typically by the speaker behind the head. Namely, the music is from the rear in listening. When viewing a multi-channel movie, only the surround audio is played, and the center audio source responsible for positioning cannot be reproduced clearly, which causes the positioning uncertainty.

However, after the invention is applied, such a problem is overcome and the virtual audio image is accurately positioned.

Although the present invention has been explained in relation to its preferred embodiment, it is to be understood that many other possible modifications and variations can be made without departing from the spirit and scope of the invention as hereinafter claimed.

What is claimed is:

1. An automotive virtual surround audio system, which is implemented in an automobile to receive left- and right-channel audio sources to accordingly reproduce virtual audio image position, the system comprising:

a synthesizer, for receiving the left- and right-channel audio sources to extend the sources into temporary rear-left and rear-right audio sources;

a weighting device, for receiving the left- and right-channel audio sources to perform weighting operation and produce temporary front-left and front-right audio sources;

a first filter, for receiving the temporary front-left and front-right audio sources to perform the filtering operation and produce virtual front-left and front-right audio sources; and a second filter for receiving the temporary rear-left and rear-right audio sources to perform a filtering operation and produce virtual rear-left and rear-right audio sources, wherein the synthesizer comprises three comb filters and a three-layer nested all-pass filter.

2. The system as claimed in claim 1, wherein angle for speakers corresponding to the virtual front-left channel audio source and the virtual front-right channel audio source are 30 degrees, respectively.

3. The system as claimed in claim 2, wherein the virtual front-left channel audio source and the virtual front-right channel audio source are expressed as:

$$\begin{bmatrix} VFL(n) \\ VFR(n) \end{bmatrix} = \begin{bmatrix} C_{11}^F(n) & C_{12}^F(n) \\ C_{21}^F(n) & C_{22}^F(n) \end{bmatrix} \otimes \begin{bmatrix} FL'(n) \\ FR'(n) \end{bmatrix},$$

where VFL(n) indicates the virtual front-left channel audio source, VFR(n) indicates the virtual front-right channel audio source, FL'(n) indicates the temporary front-left audio source, and FR'(n) indicates the temporary front-right audio source.

4. The system as claimed in claim 3, wherein the parameters $C_{11}^F(n)$, $C_{12}^F(n)$ $C_{21}^F(n)$ $C_{22}^{F(n)}$ are expressed as:

$$\begin{bmatrix} H_i^{30}(n) & H_c^{30}(n) \\ H_c^{30}(n) & H_i^{30}(n) \end{bmatrix} = \begin{bmatrix} P_{L,FL} & P_{L,FR} \\ P_{R,FL} & P_{R,FR} \end{bmatrix} \otimes \begin{bmatrix} C_{11}^F(n) & C_{12}^F(n) \\ C_{21}^F(n) & C_{22}^F(n) \end{bmatrix},$$

where $H_i^{30}(n)$ indicates a 30-degree-same-side head related transfer function (HRTF), $H_c^{30}(n)$ indicates a 30-degree-counter-side HRTF, $P_{L,FL}$ indicates a transfer function for front-left speaker to left ear, $P_{R,FL}$ indicates ndicates a transfer function for the front-left speaker to right ear, $P_{L,FR}$ indicates ndicates a transfer function for front-right speaker to the left ear, and $P_{R,FR}$ indicates a transfer function for the front-right speaker to the right ear.

5. The system as claimed in claim 2, wherein the virtual rear-left channel audio source and the virtual rear-right channel audio source are expressed as:

$$\begin{bmatrix} VRL(n) \\ VRR(n) \end{bmatrix} = \begin{bmatrix} C_{11}^R(n) & C_{12}^R(n) \\ C_{21}^R(n) & C_{22}^R(n) \end{bmatrix} \otimes \begin{bmatrix} RL'(n) \\ RR'(n) \end{bmatrix},$$

where VRL(n) indicates the virtual rear-left channel audio source, VRR(n) indicates the virtual rear-right channel audio source, RL'(n) indicates the temporary rear-left audio source, and RR' (n) indicates the temporary rear-right audio source.

6. The system as claimed in claim 5, wherein the parameters $C_{11}^R(n)$, $C_{12}^R(n)$ $C_{21}^R(n)$ $C_{22}^R(n)$ are expressed as:

$$\begin{bmatrix} H_i^{110}(n) & H_c^{110}(n) \\ H_c^{110}(n) & H_i^{110}(n) \end{bmatrix} = \begin{bmatrix} P_{L,RL} & P_{L,RR} \\ P_{R,RL} & P_{R,RR} \end{bmatrix} \otimes \begin{bmatrix} C_{11}^R(n) & C_{12}^R(n) \\ C_{21}^R(n) & C_{22}^R(n) \end{bmatrix},$$

where $H_i^{110}(n)$ indicates a 110-degree-same-side HRTF, $H_c^{110}(n)$ indicates a 110-degree-counter-side HRTF, PL,RL indicates a transfer function for rear-left speaker to left ear, PR,RL indicates a transfer function for the rear-left speaker to right ear, PL,RR indicates a transfer function for rear-right speaker to the left ear, and PR,RR indicates a transfer function for the rear-right speaker to the right ear.

* * * * *